United States Patent
Gage et al.

(10) Patent No.: US 8,033,771 B1
(45) Date of Patent: Oct. 11, 2011

(54) MINIMUM CONTACT AREA WAFER CLAMPING WITH GAS FLOW FOR RAPID WAFER COOLING

(75) Inventors: Christopher Gage, Campbell, CA (US); Charles E. Pomeroy, San Jose, CA (US); David Cohen, San Jose, CA (US); Nagarajan Kalyanasundaram, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 319 days.

(21) Appl. No.: 12/333,239

(22) Filed: Dec. 11, 2008

(51) Int. Cl.
*H01L 21/677* (2006.01)

(52) U.S. Cl. .......... 414/217; 414/805; 414/935

(58) Field of Classification Search .......... 414/217, 414/805, 935; 118/715; 438/758
See application file for complete search history.

(56) References Cited

U.S. PATENT DOCUMENTS

| | | | |
|---|---|---|---|
| 3,612,825 A | 10/1971 | Chase et al. |
| 4,457,359 A | 7/1984 | Holden |
| 4,535,835 A | 8/1985 | Holden |
| 4,563,589 A | 1/1986 | Scheffer |
| 4,960,488 A | 10/1990 | Law et al. |
| 5,113,929 A | 5/1992 | Nakagawa et al. |
| 5,178,682 A | 1/1993 | Tsukamoto et al. |
| 5,228,208 A | 7/1993 | White et al. |
| 5,282,121 A | 1/1994 | Bornhorst et al. |
| 5,308,989 A | 5/1994 | Brubaker |
| 5,447,431 A | 9/1995 | Muka |
| 5,558,717 A | 9/1996 | Zhao et al. |
| 5,588,827 A | 12/1996 | Muka |
| 5,811,762 A | 9/1998 | Tseng |
| 5,909,994 A | 6/1999 | Blum et al. |
| 6,072,163 A | 6/2000 | Armstrong et al. |
| 6,087,632 A | 7/2000 | Mizosaki et al. |
| 6,106,625 A | 8/2000 | Koai et al. |
| 6,200,634 B1 | 3/2001 | Johnsgard et al. |
| 6,214,184 B1 | 4/2001 | Chien et al. |
| 6,228,438 B1 | 5/2001 | Schmitt |
| 6,307,184 B1 | 10/2001 | Womack et al. |
| 6,394,797 B1 | 5/2002 | Sugaya et al. |
| 6,413,321 B1 | 7/2002 | Kim et al. |
| 6,467,491 B1 | 10/2002 | Sugiura et al. |
| 6,518,195 B1 | 2/2003 | Collins et al. |
| 6,559,424 B2 | 5/2003 | O'Carroll et al. |

(Continued)

FOREIGN PATENT DOCUMENTS

JP 62-229833 10/1987

(Continued)

OTHER PUBLICATIONS

International Search Report and Written Opinion dated Aug. 2, 2010, from Application No. PCT/US2009/067040.

(Continued)

*Primary Examiner* — Scott Lowe
(74) *Attorney, Agent, or Firm* — Weaver Austin Villeneuve & Sampson LLP (57) ABSTRACT

Apparatuses and methods for cooling and transferring wafers from low pressure environment to high pressure environment are provided. An apparatus may include a cooling pedestal and a set of supports for holding the wafer above the cooling pedestal. The average gap between the wafer and the cooling pedestal may be no greater than about 0.010 inches. Venting gases may be used to increase the pressure inside the apparatus during the transfer. In certain embodiment, venting gases comprise nitrogen.

28 Claims, 7 Drawing Sheets

U.S. PATENT DOCUMENTS

| | | | |
|---|---|---|---|
| 6,563,092 B1 | 5/2003 | Shrinivasan et al. | |
| 6,639,189 B2 | 10/2003 | Ramanan et al. | |
| 6,860,965 B1 | 3/2005 | Stevens | |
| 6,895,179 B2 | 5/2005 | Kanno et al. | |
| 6,899,765 B2 | 5/2005 | Krivts et al. | |
| 7,105,463 B2 * | 9/2006 | Kurita et al. | 438/782 |
| 7,138,606 B2 | 11/2006 | Kanno et al. | |
| 7,253,125 B1 | 8/2007 | Bandyopadhyay et al. | |
| 7,265,061 B1 | 9/2007 | Cho et al. | |
| 7,327,948 B1 | 2/2008 | Shrinivasan et al. | |
| 7,410,355 B2 | 8/2008 | Granneman et al. | |
| 7,422,406 B2 | 9/2008 | van der Meulen | |
| 7,576,303 B2 | 8/2009 | Natsuhara et al. | |
| 7,665,951 B2 * | 2/2010 | Kurita et al. | 414/805 |
| 7,845,891 B2 * | 12/2010 | Lee et al. | 414/217 |
| 7,941,039 B1 | 5/2011 | Shrinivasan et al. | |
| 7,960,297 B1 | 6/2011 | Rivkin et al. | |
| 2002/0005168 A1 | 1/2002 | Kraus et al. | |
| 2002/0033136 A1 | 3/2002 | Savage et al. | |
| 2002/0117109 A1 | 8/2002 | Hazelton et al. | |
| 2002/0162630 A1 | 11/2002 | Satoh et al. | |
| 2003/0013280 A1 | 1/2003 | Yamanaka | |
| 2003/0113187 A1 | 6/2003 | Lei et al. | |
| 2004/0023513 A1 | 2/2004 | Aoyama et al. | |
| 2004/0060917 A1 | 4/2004 | Liu et al. | |
| 2004/0183226 A1 | 9/2004 | Newell et al. | |
| 2004/0187790 A1 | 9/2004 | Bader et al. | |
| 2004/0194268 A1 | 10/2004 | Halsey et al. | |
| 2005/0045616 A1 | 3/2005 | Ishihara | |
| 2005/0258164 A1 * | 11/2005 | Hiramatsu et al. | 219/443.1 |
| 2006/0018639 A1 | 1/2006 | Ramamurthy et al. | |
| 2006/0081186 A1 | 4/2006 | Shinriki et al. | |
| 2006/0245852 A1 | 11/2006 | Iwabuchi | |
| 2007/0107845 A1 | 5/2007 | Ishizawa et al. | |
| 2007/0205788 A1 * | 9/2007 | Natsuhara et al. | 324/760 |
| 2007/0243057 A1 * | 10/2007 | Shimada et al. | 414/935 |
| 2009/0060480 A1 | 3/2009 | Herchen | |
| 2009/0142167 A1 | 6/2009 | Gage et al. | |
| 2009/0277472 A1 | 11/2009 | Rivkin et al. | |
| 2010/0270004 A1 | 10/2010 | Landess et al. | |

FOREIGN PATENT DOCUMENTS

| | | |
|---|---|---|
| JP | 01-107519 | 5/1989 |
| JP | 06-037054 | 2/1994 |
| JP | 07-147274 | 6/1995 |
| JP | 09-092615 | 4/1997 |
| JP | 2005-116655 | 4/2005 |
| KR | 10-2003-0096732 | 12/2003 |
| WO | 00/60414 | 10/2000 |
| WO | 02/11911 | 2/2002 |

OTHER PUBLICATIONS

U.S. Office Action mailed Oct. 3, 2007, from U.S. Appl. No. 11/115,576.

U.S. Final Office Action mailed May 2, 2008, from U.S. Appl. No. 11/115,576.

U.S. Office Action mailed Oct. 17, 2008, from U.S. Appl. No. 11/115,576.

U.S. Office Action mailed Jun. 16, 2008, from U.S. Appl. No. 11/546,189.

U.S.Final Office Action mailed Oct. 16, 2008, from U.S. Appl. No. 11/546,189.

U.S. Office Action mailed Jul. 18, 2006, from U.S. Appl. No. 11/184,101.

Notice of Allowance and Fee Due mailed Jan. 25, 2007, from U.S. Appl. No. 11/184,101.

Allowed Claims from U.S. Appl. No. 11/184,101.

Gage et al., "Loadlock Designs and Methods for Using Same," Novellus Systems, Inc., U.S. Appl. No. 11/998,528, filed Nov. 30, 2007.

U.S. Office Action mailed Dec. 14, 2010 for U.S. Appl. No. 11/998,528.

Shrinivasan et al., "Pedestal Heat Transfer and Temperature Control," Novellus Systems, Inc., U.S. Appl. No. 11/851,310, filed Sep. 6, 2007.

U.S. Appl. No. 11/937,364, Office Action mailed Apr. 9, 2010.

U.S. Appl. No. 11/115,576, Office Action mailed Apr. 22, 2009.

U.S. Appl. No. 11/115,576, Office Action mailed Apr. 15, 2010.

U.S. Appl. No. 11/129,266, "Tailored profile pedestal for thermoelastically stable cooling for heating of substrates", Landess et al., filed May 12, 2005.

U.S. Appl. No. 11/129,266, Office Action mailed Feb. 20, 2009.

U.S. Appl. No. 11/129,266, Office Action mailed Oct. 28, 2009.

U.S. Appl. No. 11/608,185, Office Action mailed Apr. 26, 2010.

U.S. Appl. No. 11/751,584, "Cast pedestal with heating element on coaxial heat exchanger", Shrinivasan et al., filed May 21, 2007.

U.S. Appl. No. 11/851,310, Office Action mailed Jun. 8, 2010.

U.S. Appl. No. 12/341,943, "Atomic layer removal for high aspect ratio gapfill", van Schravendijk et al., filed Dec. 22, 2008.

U.S. Appl. No. 61/122,308, "Conductively cooled process for wide temperature range processes", Nieh et al., filed Dec. 12, 2008.

U.S. Appl. No. 12/341,943, Office Action mailed Jun. 11, 2010.

U.S. Appl. No. 11/608,185, Office Action mailed Nov. 26, 2010.

U.S. Appl. No. 12/8341,943, Office Action mailed Dec. 23, 2010.

Notice of Allowance for U.S. Appl. No. 11/851,310, mailed Jan. 5, 2011.

Allowed Claims for U.S. Appl. No. 11/851,310, as of mailed Jan. 5, 2011.

U.S. Appl. No. 11/937,364, Final Office Action mailed Dec. 27, 2010.

Shrinivasan et al., "Single-Chamber Sequential Curing of Semiconductor Wafers," Novellus Systems, Inc., U.S. Appl. No. 11/115,576, filed Apr. 26, 2005.

Doble et al., "Concave Pedestal for Uniform Heating of Silicon Wafers," Novellus Systems, Inc., U.S. Appl. No. 11/546,189, filed Oct. 10, 2006.

Nordin et al., "Closed Loop Temperature Heat Up and Control Utilizing Wafer-To-Heater Pedestal Gap Modulation," Novellus Systems, Inc., U.S. Appl. No. 11/937,364, filed Nov. 8, 2007.

Gage et al., "Transferring Heat in Loadlocks," Novellus Systems, Inc., U.S. Appl. No. 12/140,196, filed Jun. 16, 2008.

Rivkin et al., "Photoresist Stripping Method and Apparatus," Novellus Systems, Inc., U.S. Appl. No. 61/050,880, filed May 6, 2008.

U.S. Appl. No. 11/937,364, Office Action mailed Dec. 27, 2010.

Notice of Allowance for U.S. Appl. No. 11/608,185, mailed Mar. 22, 2011.

U.S. Appl. No. 13/086,010, "High Temperature Pedestal Overlay for Stable & Uniform Heat Transfer", Angelov et al., filed Apr. 13, 2011.

U.S. Final Office Action mailed Apr. 7, 2011 from U.S. Appl. No. 11/998,528.

* cited by examiner

MINIMUM CONTACT AREA WAFER CLAMPING WITH GAS FLOW FOR RAPID WAFER COOLING

FIELD OF THE INVENTION

The present invention relates generally to methods and apparatus for transferring wafers using load locks and more particularly to methods and apparatus for cooling wafers while being transferred between lower pressure and higher pressure environments.

BACKGROUND OF THE INVENTION

Many semiconductor manufacturing operations are performed at low pressures and high temperatures. Processing modules are often kept at low pressures while wafers are transferred between low and high pressure environments using load locks. Load locks effectively isolate two environments and eliminate the need for repeatedly cycling processing modules, which typically have large internal volumes, between different pressure levels. Instead, only small volume load locks are cycled during wafer transfers. Some configurations include several processing modules integrated with one or more internal wafer handling modules on the low pressure side of the processing system. Wafers may go through several processes without being transferred to a high pressure environment.

After processing, wafers must be removed from a low pressure processing module and placed into an atmospheric environment for, e.g., storage. Such wafers may need to be cooled to certain temperatures before being exposed to oxygen to prevent oxidation, out-gassing, and damage to storage modules. Rapid but uniform cooling is highly desired but is often difficult to achieve. To maintain high throughput, only a few seconds are afforded for the entire transfer process. Wafers often need to be cooled by more than 200° C. usually by positioning wafers close to a cold surface, e.g. a cooling pedestal. Often wafers are not flat and require relatively large set distances between the cold surface and a default wafer position to avoid direct contact. Since it is not practical to adjust the distances individually for each wafer, the separation distance must be set to non-optimum value (corresponding to the worst possible wafer deformation), resulting in generally poor heat transfer. Thus, load locks employ expensive venting gases such as helium, which has a high heat transfer coefficient, and even then prolonged cooling periods are required. A non-uniform gap between the cooling surface and the wafer also causes uneven cooling, leaving a hot spot in the areas bowing up (away) from the cooling surface, which could cause excessive stress possibly leading to wafer breakage.

Some solutions include electrostatic or vacuum clamping mechanisms to modify the shape of heat deformed wafers. Unfortunately, these solutions require large contact areas with wafer backsides, thereby increasing the risk of damaging the wafers and uneven cooling at contact points. Furthermore, the required clamping mechanisms are complex and expensive.

Therefore, there is a need for improved methods and apparatus that provide effective cooling during wafer transfer in load locks.

SUMMARY

The present invention provides a load lock where a wafer is separated from a cooling pedestal by no more than about 0.010 inch on average (over the surface of the wafer supported by the pedestal). Such small gaps allow use of inexpensive venting gases and shorten the required cooling time. Bowed wafers are flattened against the contact pins of a pedestal by a designed pressure differential between the front side and back side of the wafer. The differential is created by controlling the flow of the venting gas inside the load lock. This condition can be maintained by an inventive combination of dynamically controlling pressure distribution inside the load lock, venting gas ports (particularly their shape, position, and orientation), venting gas flow rates, flow paths, and other parameters.

In one embodiment, a load lock includes an inlet and outlet transfer ports, a pedestal with a surface for absorbing heat from the wafers, a venting gas port located above pedestal surface and configured for delivering venting gases, and a set of supports provided on a pedestal surface. In certain embodiments, the set includes at least four supports having heights that provide an average gap between the wafer and the pedestal surface of no greater than about 0.010 inches, when the wafer is located on the supports. In more specific embodiments, the average gas is no greater than about 0.005 inches and in even more specific embodiments no greater than about 0.002 inches.

The venting gas port may be defined by a lid and a body of the load lock. In certain embodiments, the opening of the venting gas port has a diameter of between about 4 inches and 8 inches, or more specifically between about 6 inches and 6.5 inches. In the same or other embodiments, the width of the opening has width of between about 0.010 inches and 0.100 inches. A venting gas source may be coupled to the port and provide a venting gas that is substantially free of helium. In certain embodiments, the venting gas includes nitrogen.

The shape of the pedestal inside the load lock may be designed to provide uniform heat transfer. In certain embodiments, the pedestal surface has a convex shape. The difference between gaps around the edge and the center of the wafer may be between about 0.001 inches and 0.010 inches. In more specific embodiments, this difference is between about 0.001 inches and 0.003 inches.

Supports are distributed over the pedestal surface to control wafer's profile relative to the pedestal surface. At least ten supports are provided in certain embodiments. The supports may be arranged in at least two rings. The first ring is positioned between about 4 inches and 6 inches from the center of the pedestal, and the second ring is positioned between about 1 inches and 3 inches. At least six supports may be provided within the first ring and at least three supports within the second ring. The tips of the supports may provide a flat plane above the surface of the pedestal.

Supports may have different designs and be made from materials chosen to ensure adequate support of the wafer without causing damage. For example, supports may have rounded tips. In certain embodiments, the supports have diameter of between about 0.020 inches and 0.125 inches. The supports may be made from a thermally insulating material. In the same or other embodiments, the supports include an electrically conductive ceramic material.

The load lock may also have an associated controller containing program instructions for providing a wafer into the load lock, positioning the wafer on the supports, closing the inlet transfer port, controlling pressure inside the load lock to keep the wafer in contact with at least 70% of the supports, and then opening the outlet transfer port and removing the wafer. Certain embodiments of this invention include a method of practicing the above listed instructions. The pressure may be controlled by providing a venting gas that is substantially free of helium. The pressure may be increased at a rate of at least 30 Torr per seconds during the controlling operation. In the same or other embodiments, the venting gas may be provided at a flow rate between about 10 and 50 standard liters per minute. The pressure controlling operation may last less than 15 seconds. The temperature of the wafer may decrease by at least 200 degrees Centigrade during this time.

These and other features and advantages of the invention will be set forth below in more detail below with reference to the associated drawings.

DETAILED DESCRIPTION OF A PREFERRED EMBODIMENT

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

INTRODUCTION

Load locks are used to transfer wafers between environments at two different pressure levels. Load locks are also often used to cool wafers when transferring them from a low pressure processing side to an atmospheric pressure storage side. For the purposes of this description, "low pressure" and "high pressure" are terms applying to many different pressure regimes. In general they represent two different pressures, usually in the context of a low pressure side of a load lock and a high pressure side of load lock. In certain embodiments, "low pressure" refers to a pressure between about $10^{-9}$ Torr (1 nanoTorr) and 100 Torr. In a more specific range, a low pressure is between about $5 \times 10^{-4}$ Torr (0.5 mTorr) and 1 Torr. In another embodiment, the low pressure is between 20 Torr and 60 Torr. In many applications calling for load locks, a process producing hot wafers is performed at low pressure.

Any pressure level above the low pressure is referred to as "high pressure." In certain embodiment, the high pressure is ambient pressure or thereabouts. In other embodiments, the low pressure is less than ambient pressure.

In the context of this description, "venting" is increasing the pressure inside the load lock by, e.g., supplying one or more of the venting gases. The load lock is typically equipped with a venting port to introduce the venting gas. A transfer and cooling process may have one or more venting cycles.

"Pumping" or "vacuuming" refers to reduction of the pressure inside the load lock by, e.g., opening a vacuum port and letting gases escape from the load lock. A vacuum pump or a vacuum facility line may be attached to the vacuum port. In certain embodiments, venting coincides with pumping. For example, both venting and vacuum ports are open and venting gases are introduced and removed from the load lock at the same time. This may be done, for example, to control pressure differential on opposite sides of the wafer irrespectively of the pressure changes inside the load lock.

Wafers may come from processing modules at temperatures substantially higher than acceptable for exposing wafers to ambient conditions and placing wafers into storage modules. For example, wafers are at about 350° C. after a typical CVD process. They must be cooled to below 70° C. before exposure to oxygen. It takes only two to three seconds for an internal transfer system to move a wafer from a processing module to a load lock and a few more seconds (typically 10-15 seconds) to bring the load lock to atmospheric pressure before the wafer is removed. Usually, no additional time is allowed for the wafer to cool in order to ensure high process throughput.

A wafer starts cooling immediately after it is exposed to colder surroundings. It may start with removal from the heated pedestal of the processing module. The temperature gradient is usually the greatest at this moment. However, the heat transfer rate may still be low if the surrounding gas is at low pressure, e.g. below 100 Torr and often as low 1 Torr and even lower. The combination of these two factors, high temperature gradient and low heat transfer coefficient, may result in gradual heat loss from the wafer during the transfer. In one example, a wafer loses between about 10 and 40° C. from its initial temperature in the processing module during the first 1 to 5 seconds of the transfer process.

Figure 1:
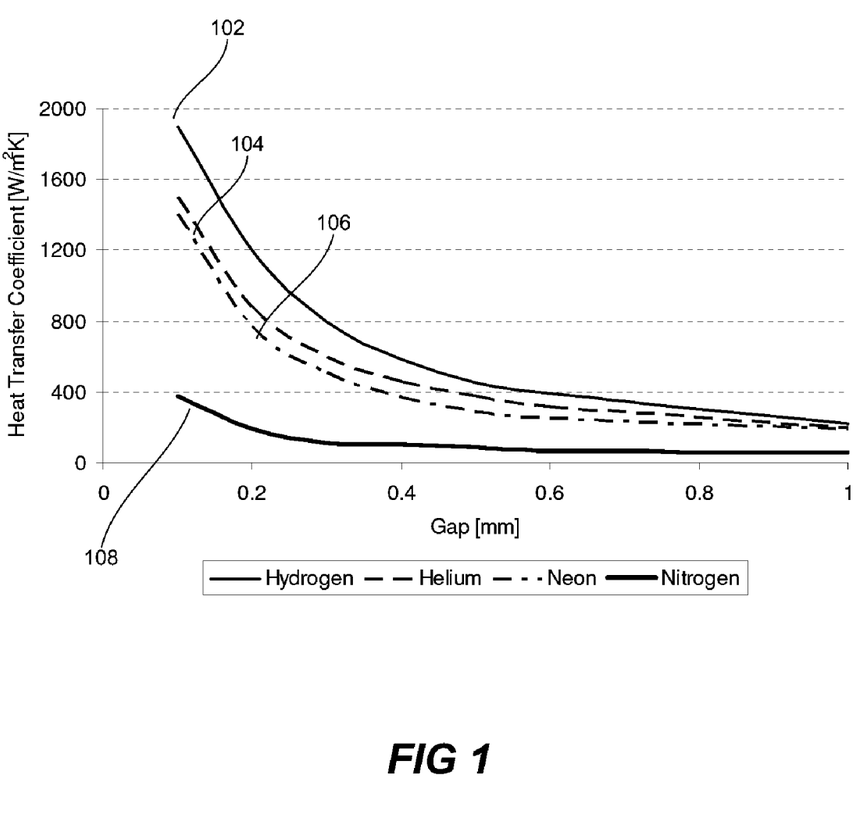
FIG. 1 illustrates a plot of effective heat transfer coefficients as a function of the gap between the wafer and the cooling pedestal for different venting gases.

While in the load lock, the wafer continues to lose heat. In certain embodiments, the wafer is positioned on top of a cooling pedestal that removes significant amounts of heat from the wafer. The amount of heat transferred depends on the distance between the wafer and the cooling pedestal in addition to other factors. Smaller distances provide for better heat transfer. However, the wafer should not touch the pedestal in order to avoid cold spots, particle contamination, and mechanical damage. FIG. 1 illustrates a plot of the effective heat transfer coefficients as a function of the average gap between the wafer and the cooling pedestal for different venting gases at about 100 Torr. The plot indicates that the effective heat transfer coefficients substantially increase as the average gap drops below 0.2-0.3 mm (or approximately 0.008 inches-0.012 inches). For example, inexpensive nitrogen (line 108) has proved to be as effective at 0.2 mm (0.008 inches) gap as much more expensive helium (line 104) at 1 mm (0.039 inches) gap. Other modeled venting gases, hydrogen (line 102) and neon (106), have shown similar behavior. It was also determined that these gases reach about 80% of their maximum heat transfer coefficient value upon at a pressure of about 20 Torr and then maintain substantially constant heat transfer coefficients for pressures above 100 Torr.

All wafers arrive from the processing modules having distorted shapes (i.e., they deviate from truly flat). However, the relative magnitude of the distortion can vary widely; the total variability of wafer shape can be ~0.030 inches. With helium (which has a high heat transfer coefficient), an appropriate gap is ~0.035 inches; with nitrogen (having a much lower heat transfer coefficient) the gap must be much smaller, e.g., ~0.005 inches. A difficult problem to solve is consistently (from wafer-to-wafer) maintaining a 0.005 inch gap while confronting a 0.030 inch variability in wafer shape. A challenge facing the inventors was to find a way to reproducibly flatten heated wafers in a load lock and at the same time greatly reduce the average distance between the wafer surface and a heat transfer surface (e.g., a pedestal) to allow rapid cooling in the presence of a gas with a relatively poor heat transfer.

In certain embodiments further described below, a small gap is maintained by minimum contact area (MCA) supports extending slightly above the top surface of the pedestal. The MCA supports are positioned in such way as to define a plane with their tips. In some examples, the top surface of the pedestal has a curvature or some other non-planar shape. Such shapes result in some parts of the pedestal, usually the edges, being further away from the wafer than others, usually the center. In this example, a "center gap" is a gap corresponding to the center of the horizontally aligned wafer, and an "edge gap" is the one corresponding to the edge of such wafer. In specific embodiments, the edge gap is the same along the entire perimeter of the wafer. An "average gap" is a numerical average of the center gap and the edge gap.

A difference between the edge and center gaps is used to achieve uniform cooling. Without efforts to even out heat transfer over the radius of a wafer, the wafer will tend to cool faster from the edges. In certain embodiments, the pedestal profile is driven by the profile of the venting gas flow rates between the wafer and the pedestal. In certain embodiments, the venting gas is introduced into the load lock from outside the pedestal and flows into the gap between the pedestal and the wafer. The flow rate is highest around the edges of the wafer and lowest at the center. Heat transfer between a surface and fluid is greater if the fluid in contact with the surface has higher velocity. Therefore, in some embodiments, the edge gap may be greater than the center gap to compensate for higher flow rates of the venting gas around the edge of the wafer. In other words, a convex pedestal shape is employed to promote heat transfer from the center of the wafer.

Apparatus

Figure 2:
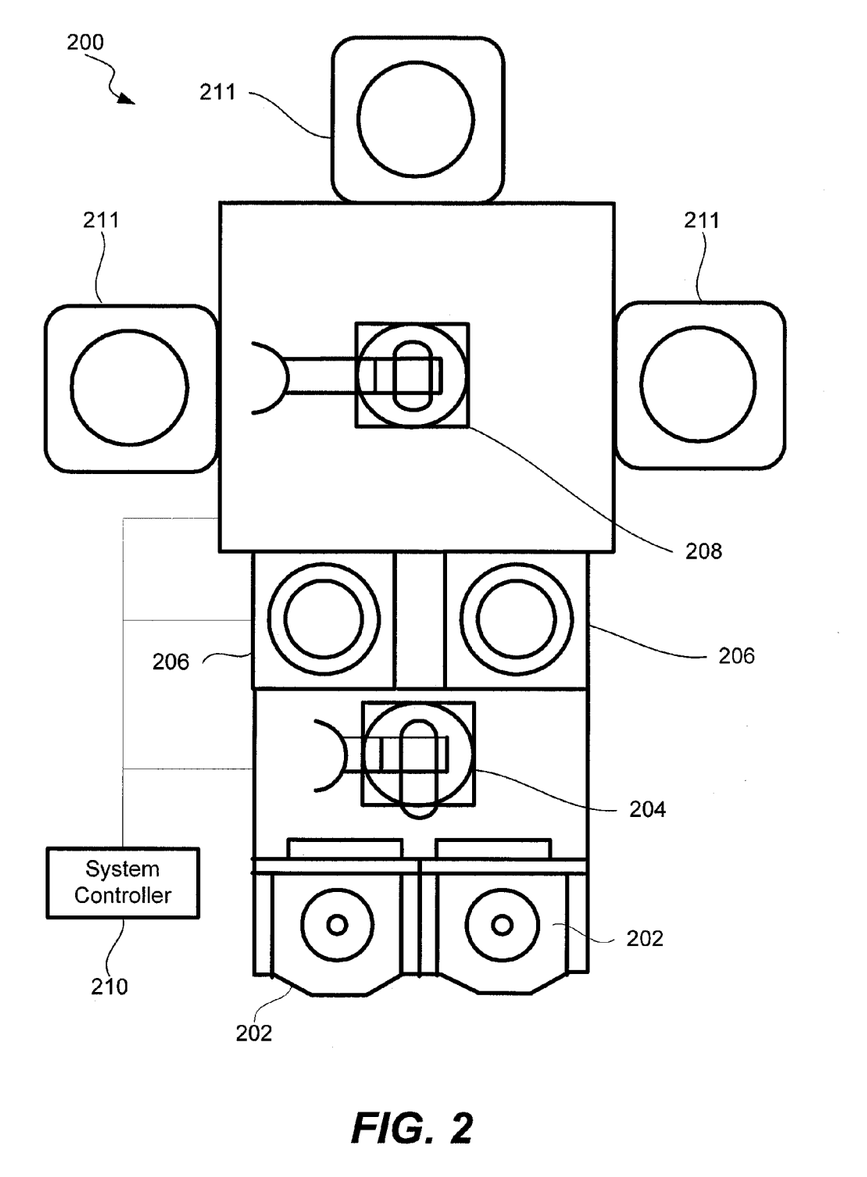
FIG. 2 is a schematic illustration of the overall semiconductor processing system including the load locks, the processing modules, the internal and external wafer transfer modules, and the wafer storage modules.

FIG. 2 shows a semiconductor processing system 200 in accordance with certain embodiments of the present invention. Wafers may be provided to the system in wafer-storing modules 202. For example, Front Opening Unified Pods (FOUPs) may be used to provide and receive wafers from the system. An external wafer handling system 204 may include a robot arm and used to transfer wafers between the wafer-storing modules 202 and the load locks 206. The wafers are placed into and removed from the load locks 206 through the corresponding external ports. The wafer-storing modules 202 and the external wafer handling system 204 are the only illustrated components that operate at high pressure, such as ambient pressure of the production facility where the system 200 is present. In alternative embodiments, the load locks 206 may be used to transfer wafers between two internal sides of the processing system operating at different pressure levels that are both lower than ambient pressure.

The load locks 206 are cycled between the low pressure and the high pressure keeping the external side isolated from the processing side. This approach eliminates the need to vent and then pump the entire low pressure side, e.g. the internal wafer handling module 208 and the processing modules 211, after each processing of each wafer. In certain embodiments, the load locks 206 are designed to have minimal internal volumes sufficient to accommodate one or more wafers and provide access to robot arms of wafer handling systems. In certain embodiments, the volume of the load locks 206 may be between about 1 and 10 liters. In more specific embodiments, the load lock volume may be between about 2 and 5 liters.

The low pressure side may include one or more internal wafer handling modules 208 and one or more processing modules 211, such as one or more Physical Vapor Deposition (PVD) chambers, Chemical Vapor Deposition (CVD) chambers, Atomic Layer Deposition (ALD) chambers, degas modules, pre-clean modules, reactive pre-clean (RPC) modules, cooling modules, additional load-locks, a backbone and other types of modules. While an illustrative example of FIG. 2 only includes three processing modules 211 and one internal wafer handling module 208, the system 200 may have any number and combinations of modules. The internal wafer handling module 208 is used to transfer wafers among different processing modules 211 and the load locks 206

The invention is not limited to the semiconductor wafer processing system configurations described above. For example, one or more multi-station reactors may be coupled to a transfer module that is coupled to one or more load locks. Suitable semiconductor processing tools, for example, include the Novellus Sequel, Inova, Altus, Speed, and different Vector systems (e.g., Vector Extreme, Vector Express, Vector AHM), produced by Novellus Systems of San Jose, Calif. The reactors need not be multi-station reactors, but may be single station reactors. Similarly, the load locks may be multiple wafer load locks, for example dual wafer load locks.

The processing system 200 may include a system controller 210 that may receive feedback signals from various modules of the system and supply back control signals back to the same or other modules. The system controller 210 may control operation of the load locks 206, such as timing of the cycles, pressure levels, timing and flow rates of venting and purging gases, pumping, and many other process variables. In general aspects of the present invention, the control system 210 may synchronize the operation of the load locks 206 with respect to other modules, such as the external wafer handling module 204 and the internal wafer handling module 208. In more specific aspects of the present invention, the system controller 210 may control operation of valves and flow meters of the venting and purging gas lines and/or the vacuum lines of the load locks 206 and mechanisms opening and closing internal and external ports of the load locks 206. The system controller 210 may be part of an overall system-wide controller that is responsible for operations of the various processing modules, the backbone, etc.

In the depicted embodiment, the system controller 210 is employed to control process conditions when providing the substrate wafer to the load lock, closing the transfer port of the load lock, venting the load lock, pumping the load lock, opening the load lock's ports, and removing the wafer.

The system controller 210 may include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller or they may be provided over a network.

In certain embodiments, the system controller 210 controls all of the activities of the processing system. The system controller executes system control software including sets of instructions for controlling the timing of the processing operations, pressure levels, flow rates, and other parameters of a particular process. Other computer programs, scripts or routines stored on memory devices associated with the controller may be employed in some embodiments.

Typically, there is a user interface associated with the system controller 210. The user interface may include a display screen, graphical software to display process conditions, and user input devices such as pointing devices, keyboards, touch screens, microphones, etc.

The computer program code for controlling the above operations can be written in any conventional computer readable programming language: for example, assembly language, C, C++, Pascal, Fortran or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

Figure 3A:
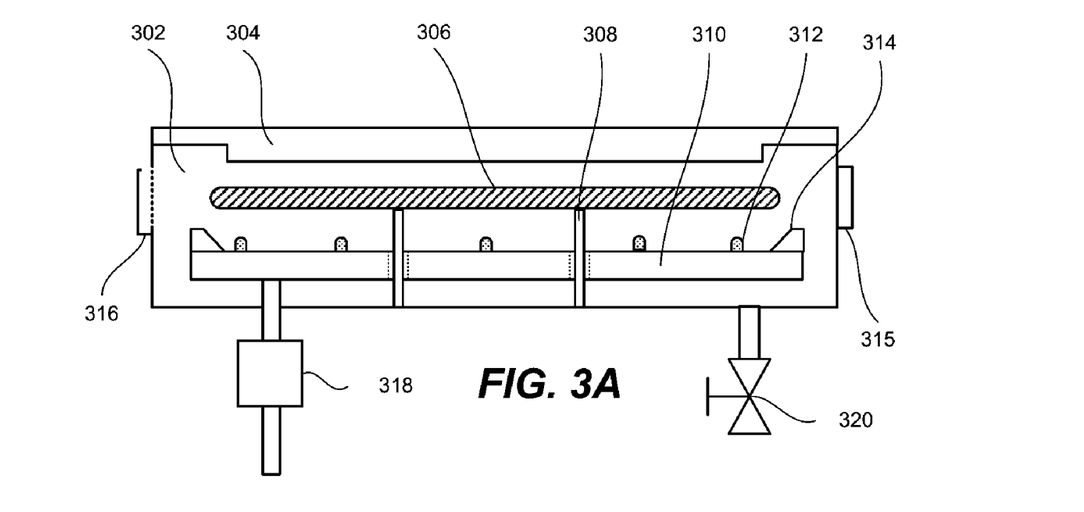
FIG. 3A is a cross-sectional view of the load lock system with a cooling pedestal in a lowered position and a wafer being supported by intermediate support pins above the pedestal in accordance with one embodiment the present invention.

FIG. 3A illustrates a cross-sectional view of the load lock during loading or unloading of a wafer 306 when a cooling pedestal 310 is in the lowered position. The load lock has a body 302 and a lid 304 that seal the load lock from the external environment. In certain embodiments, the lid 304 has a venting port. The lid may also form a venting path together with the body 302 for supplying venting gas from the port into the load lock further described in the context of FIGS. 4A and 4B.

The cooling pedestal 310 is typically made out of aluminum, stainless steel, or any other suitable thermally conductive materials. The cooling pedestal 310 may have a set of channels for circulating a cooling media through the pedestal. In certain embodiments, the cooling media may be primarily water or other suitable liquid maintained at between about, e.g., 15° C. and 35° C. In other embodiments, other circulating heat transfer media are used; e.g., super-cooled nitrogen or galden. The cooling pedestal 310 may have a drive 318 attached for moving the pedestal 310 in a vertical direction between its lowered (shown in FIG. 3A) and raised (shown in FIG. 3B) positions. In other embodiments, the pedestal is stationary, and the wafer lift provides initial support to the wafer and later brings the wafer towards the pedestal for heat transfer.

The cooling pedestal 310 may have a set of alignment cones 314 for horizontal alignment of the wafer 306 relative to the cooling pedestal 310. Other embodiments (not shown) employ moving parts such as an appropriately configured wafer lift that do not require alignment features. In certain embodiments, the pedestal 310 has a set of minimum contact area (MCA) supports 312 for a vertical alignment and for re-shaping or flattening the wafer 306 when it is warped. The depicted load lock is equipped with intermediate support pins 308 made out of stainless steel or any other suitable material. The load lock also has different adapters for connecting venting, purging, and vacuuming lines (not shown). The load lock has two transfer ports 315 and 316 for accessing load lock from low and high pressure sides and brining the wafer 306 in and out. One transfer port 315 may be designated as an external transfer port for accessing the high pressure side. Another transfer port 316 may be designated as an internal transfer port for accessing the low pressure side.

A few operations of the overall transferring process are presented to further illustrate the configuration and function of the load lock's elements in accordance with certain embodiments. When internal transfer port 316 is opened, the pedestal 310 may be placed in its lowered position (as shown in FIG. 3A). The drive 318 may be actuated to bring the pedestal into the lowered position. The robot arm of the internal wafer transfer system then places the wafer 306 on the intermediate support pins 308 and retracts from the load lock.

Figure 3B:
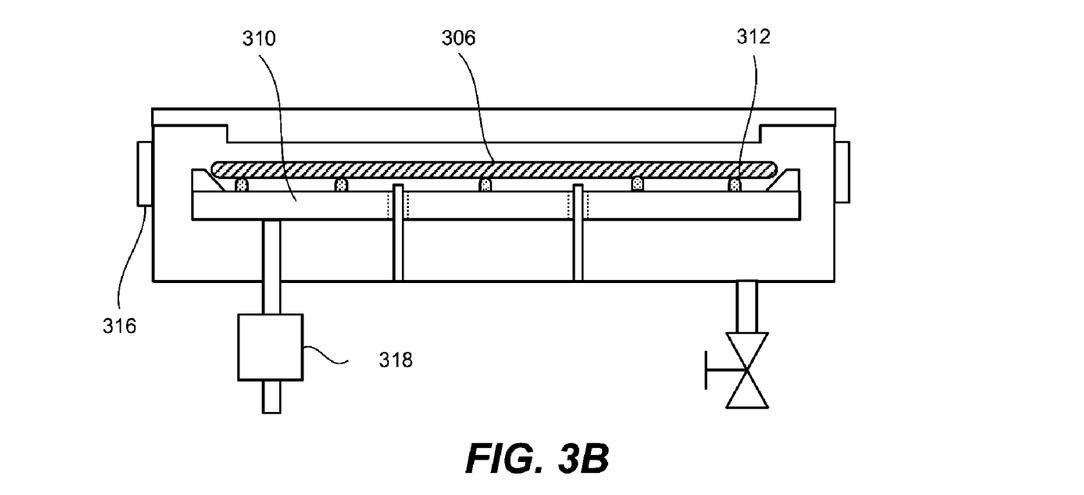
FIG. 3B is a cross-sectional view of the load lock system with a cooling pedestal in a raised position and a being wafer supported by pedestal wafer supports in accordance with one embodiment of the present invention.

The cooling pedestal 310 is then raised by the drive 318. The wafer 306 is lifted from the intermediate support pins 308 and is supported by the MCA supports 312 as shown in FIG. 3B. During this operation, the wafer 306 may be aligned in horizontal direction by one or more of the alignment cones 314. Once the wafer 306 is supported on the pedestal and the internal transfer port is closed, the load lock is now ready for venting. Typically, a system controller for the entire processing system is used to synchronize operations described herein.

Figure 4A:
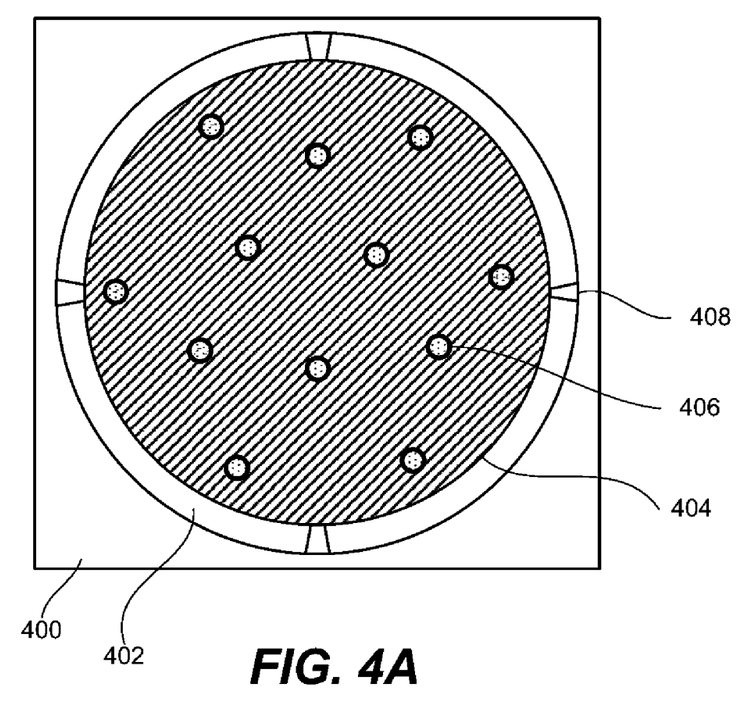
FIG. 4A is a schematic top view of the pedestal inside the load lock showing the pedestal wafer supports under the wafer and the edge locating pins around the perimeter of the wafer in accordance with one embodiment of the present invention.
Figure 4B:
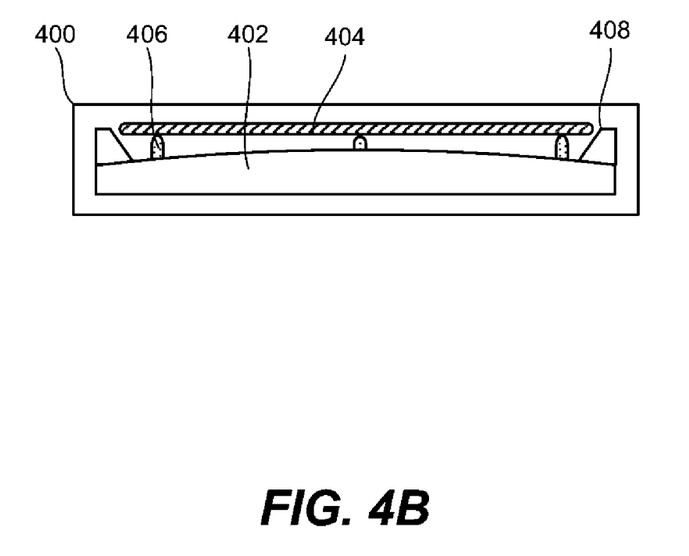
FIG. 4B is a schematic view side of the pedestal with the convex top surface and the wafer supported by the pedestal wafer supports having variable heights.

FIGS. 4A and 4B illustrate a top and a side cross-sectional views of the load lock 400 supporting the wafer 404 during the venting operation according to certain embodiments. The wafer 404 is positioned over the cooling pedestal 402 and aligned horizontally by the alignment cones 408. The wafer is supported by the MCA supports 406. FIG. 4A presents an embodiment in which the pedestal has twelve MCA supports. Any suitable number of the MCA supports 406 may be used. Generally, three or more MCA supports 406 are used. Additional MCA supports 406 may provide better support during flattening of the wafer 404, however each additional MCA support provides an extra contact point with a backside of the wafer 404 and increases risk of damaging the backside. In certain embodiments, the number of MCA supports may be between three and one hundred. In specific embodiments, the number of the MCA supports may be between nine and twenty. In one design, the pedestal has fifteen supports, twelve near the edge and three closer to the center. Some models have indicated that at least about nine are required to meet normal sag requirements; up to twenty may be used to avoid more stringent sag requirements. The spacing and number of supports typically depends on the pedestal's thermal property and the wafer's elastic and thermal properties. In certain embodiments, the MCA supports are provided with even radial and/or azimuthal (angular) spacing.

The MCA supports 406 extend from the cooling pedestal 402 and define (with their tips) a plane above the pedestal 402. In one embodiment, the tips deviate from the plane by less than about 0.001 inches. In a more specific embodiment, the deviation from that plane is about 0.0002 inches or less, and in an even more specific case about 0.0005 inches or less. The MCA supports 406 may be spaced relative to each other to provide the least sag of the wafer 404 during cooling.

In some embodiments, the MCA supports 406 and/or the alignment cones 408 are made of any conductive materials that provide not only adequate support and alignment of the wafer, but as well discharge of static electricity from the backside and edges of the wafer 404. In a specific embodiment, the MCA supports 406 and/or the alignment cones 408 are made from electrically conductive ceramics, such as Cerastat having volume resistivity between $10^3$ to $10^{12}$ Ohm-cm. The cooling pedestal 402 provides electrical connection for the MCA supports 406 and/or the alignment cones 408 to the electrical ground.

The MCA support tips may have various shapes. In one embodiment, the MCA supports 406 have rounded tips that provide very little contact area with the wafer, thereby reducing the risk of damage and minimizing localized heat transfer spikes. A direct contact between the wafer and an MCA support results in much higher heat transfer at the point of contact than in other areas where heat transfer is dependent primarily on a venting gas and proximity of the cooling pedestal. Reducing a contact area of each MCA support and a number of supports will minimize the localized heat transfer spikes. In another embodiment, the MCA supports 406 are shaped as cylinders having flat tops.

In certain embodiments, the top surface of the wafer cooling pedestal 402 (i.e. the surface facing the backside) is curved. In one embodiment, the radius of curvature is between about 1,000 inches and 10,000 inches. These radius values may provide for a difference between the edge and center gaps of 0.0174 inches and 0.0017 inches respectively for 300 mm wafers. In a more specific embodiment, the radius of curvature may be between about 4,000 inches and 8,000 inches corresponding to 0.0044 inches and 0.0022 inches gap differences for the same wafer size. The center gap may be already preset to between about 0.001 inches and 0.020 inches or more specifically to between about 0.002 inches and 0.010 inches. The table below presents various examples of pedestal designs (characterized in terms of a center gap and a radius of curvature).

TABLE 1

| Radius of Curvature [inches] | Gap Delta [inches] | Center Gap [inches] | |
|---|---|---|---|
| | | 0.001 - 0.01 | 0.002 - 0.01 |
| | | Average Gap [inches] | |
| 1,000 | 0.0174 | 0.0097 - 0.0187 | 0.0107 - 0.0187 |
| 10,000 | 0.0017 | 0.0019 - 0.0109 | 0.0029 - 0.0109 |
| 4,000 | 0.0044 | 0.0032 - 0.0122 | 0.0042 - 0.0122 |
| 8,000 | 0.0022 | 0.0021 - 0.0111 | 0.0031 - 0.0111 |

Figure 5A:
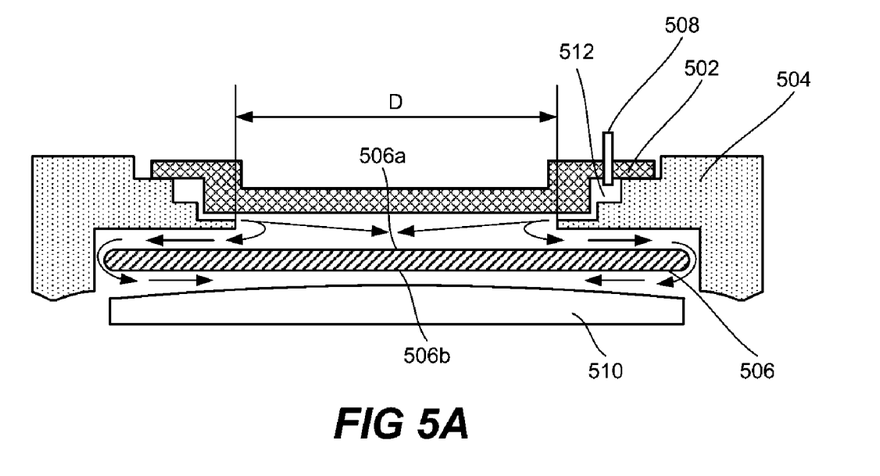
FIG. 5A is a cross-sectional view of an assembly including a lid with a venting port and a body of the load lock in accordance with one embodiment of the present invention.
Figure 5B:
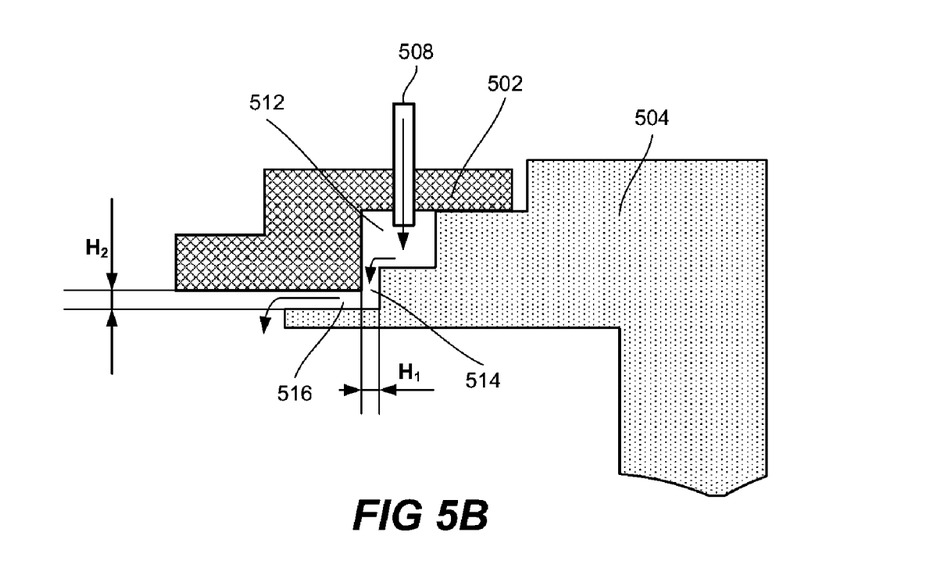
FIG. 5B is an enlarged cross-sectional view of the venting port and the inlet path for supplying venting gases into the load lock in accordance with one embodiment of the present invention.

FIG. 5A illustrates a cross-sectional view of the lid 502 and the body 504 of the load lock. In certain embodiments, the lid 502 has a venting port 508 for allowing the venting gas to enter the load lock. The port may communicate with one or more channels that are collectively referred to as a venting path. An example of this path is further illustrated in FIG. 5B. The venting port 508 allows for the venting gas to flow into a first channel 512, which may be shaped as a rectangular annular space, a ring, or various other suitable shapes. The two sides of the ring are formed by the lid 502 and the other two sides are formed by the body 504 of the load lock as shown in FIG. 5B. In certain embodiments, the sides are between about 0.125 inches and 1.000 inches. In one embodiment, the first channel 512 is larger than other channels of the venting path. This may be needed for initial distribution of the venting gas within the first channel 512 after entering into the path from the inlet tube 508. For example, the dimensions of the first channel 512 may be approximately 0.5 inches by 0.5 inches. The opening of the third channel 512 may be approximately 0.30 inches. However, in many cases any design that effectively manifolds the gas flow or delivers diffused flow above the top center of the wafer will work.

The venting gas then passes into the second channel 514. The second channel 514 may also have a profile of a rectangular ring or any other suitable shape. The second channel 514 may have a width ($H_1$) of between about 0.125 inches and 1.000 inches, more specifically between about 0.250 inches and 0.500 inches. The length of the second channel, i.e. the distance between the first channel and the third channel, may also be between about 0.010 inches and 0.125 inches, more specifically between about 0.015 inches and 0.045 inches.

The venting gas then proceeds from the second channel and into the third channel 516. The third channel 516 may also have a rectangular or other ring profile. It may have a width ($H_2$) of between about 0.010 inches and 0.125 inches, more specifically between about 0.015 inches and 0.045 inches. The length of the third channel 512 may be between about 0.010 inches and 0.125 inches, more specifically between about 0.015 inches and 0.045 inches. These dimensions should be carefully chosen for a given load lock and wafer combination to ensure even flow and not create too large of a pressure differential. The third channel 516 directs the venting gas towards the center of the chamber, above the wafer. Introducing gas in this direction prevents a jet of gas from being oriented directly towards the wafer, which eliminates one mode of defects resulting from bonding to the wafer via direct impact. Preferably venting gas flow towards the wafer only as a result of load lock interior fluid dynamics. Upon leaving the third channel the venting gas is driven by the pressure differential to the different areas of the load lock.

Returning to FIG. 5A, in the depicted embodiment, the venting gas enters the load lock from the third channel. The opening of the third channel 516 may have a diameter (D) of between about 4 inches and 10 inches, more specifically between about 6 inches and 8 inches. These dimensions presented above are for load locks designed to transfer 300 mm wafers and are scalable for load locks for other wafer sizes, e.g. 200 mm wafers. The diameter (D) determines the path length of the venting gas inside the load lock's chamber between the front 506a and back 506b sides of the wafer 506. For example, a smaller diameter corresponds to the venting gas being introduced closer to the center of the wafer and, therefore, travelling through a longer path to the backside and resulting in a higher pressure differential. The pressure differential also depends on the cross-sectional profiles that the venting gas has to transfer through and that are defined by various internal elements of the load lock. Furthermore, the distance between the front side of the wafer and the load lock's surfaces (e.g., the lid and the body) may affect the pressure differential. In certain embodiments, the distance is between about 1 and 50 mm, more specifically between about 5 and 10 mm. Generally, this distance is larger than the gap between the backside of the wafer and the pedestal. In general, the load lock design will produce a pressure gradient from the center to edge of the wafer on the backside as well as a center to edge gradient on the top side. In addition, there will be a basic gradient from the wafer's front side to backside.

In certain embodiments, a small gap between the pedestal 510 and the backside 506b may cause excessive pressure differential because the venting gas passes more slowly through smaller gaps causing slower pressure increase between the wafer and the pedestal. Too much pressure on the front side of the wafer may damage the wafer by, for example, causing excessive distortion or high mechanical stresses in the wafer. Thus, certain embodiments provide mechanisms or procedures to limit the pressure on the wafer front side. In one example, the pedestal 510 may include small grooves on its top surface to facilitate distributing the venting gas between the pedestal and the backside 506b of the wafer. Alternatively (or additionally), some of the venting gas may be supplied through the cooling pedestal 510 towards the center and other parts of the wafer 506.

In certain embodiments, pressure gradients (between the front side and the backside of the wafer) are designed to be low enough to prevent wafer distortion greater than 0.0002 inches in between wafer supports. This will be a function of the elasticity of the substrate, the distance between supports, and the pressure gradient created. Only about 0.001 psi pressure differential is required to flatten most domed wafers distorted due to compressive film stress. In certain embodiments, the pressure differential is on the order of about 0.0015 psi or greater. In the same or other embodiments, the pressure differential is less than about 1 psi. Generally, the upper and the lower pressure limits are determined by MCA support spacing, MCA support design, elasticity of the wafer, and other parameters.

Figure 6:
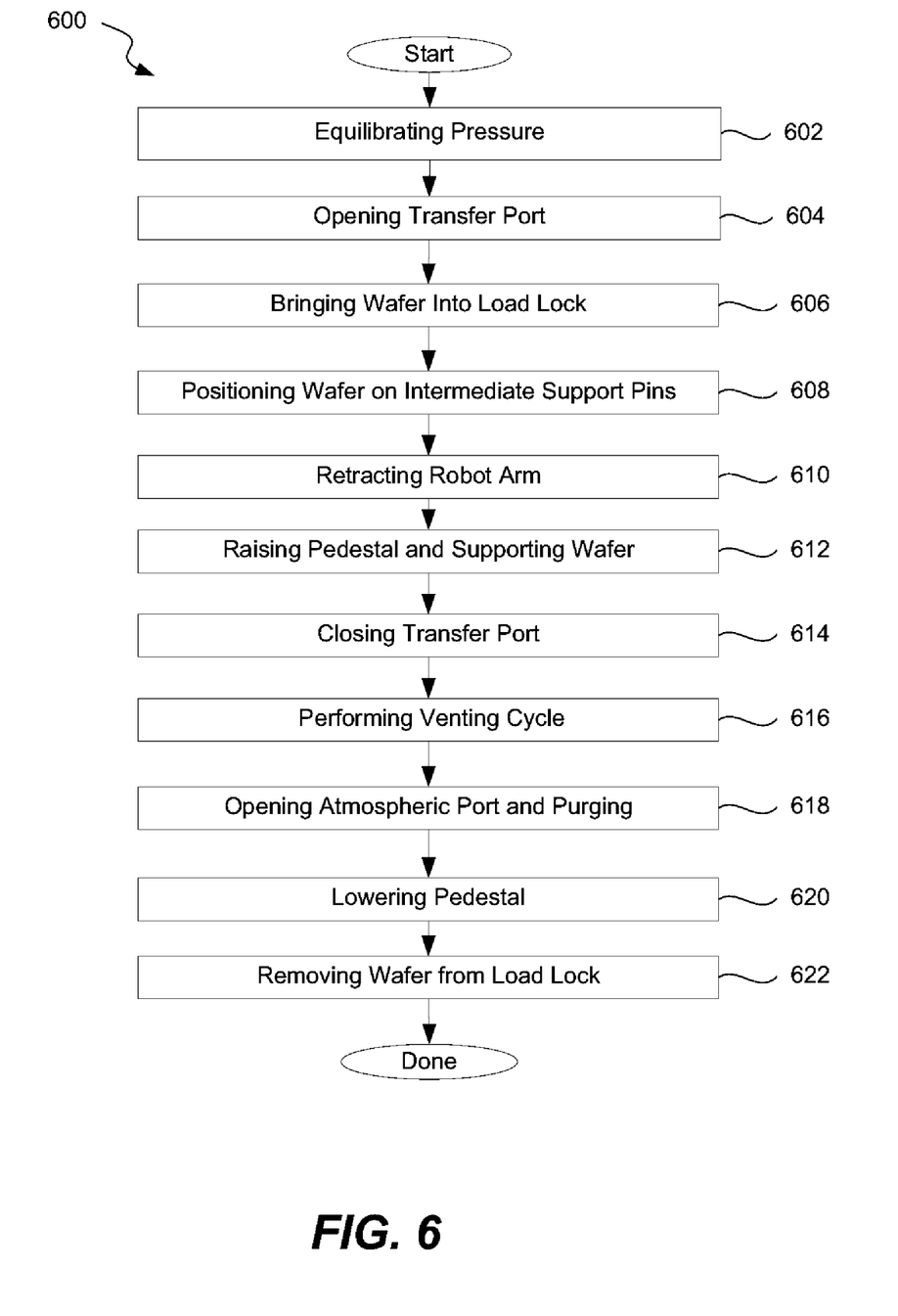
FIG. 6 illustrates a flowchart of a wafer transferring and cooling process in accordance to one embodiment of the present invention.

FIG. 6 is a flowchart depicting a process for cooling and transferring a wafer from the low to high pressure side of a load lock in accordance with certain embodiments. The depicted process starts as shown at block 602 by ensuring that the load lock has the same pressure as the side from which the transfer will be conducted, e.g. the low pressure side. The load lock may already be at this pressure, for example, if the last transfer was made to this side. The pressure may be equilibrated by opening a vacuum port and/or a port between the load lock and the low pressure side. Once the pressure is about the same on both sides of the internal transfer port, the port may be opened 604. Sometimes the port may remain open after transferring another wafer to the low pressure side. The control system then ensures that the cooling pedestal is in the lowered position. This may accomplish by, for example, sending a signal to the pedestal drive to move the cooling pedestal into the lowered position. The robot arm of the internal transfer system then carries the wafer into the load lock (block 606) and positions it on the intermediate support pins (block 608).

The robot arm is then retracted from the load lock (block 610), and the internal transfer port is closed (block 614) sealing the load lock from the low pressure side. Closing of the transfer port (block 614) may occur at any point between retracting of the robot arm and introducing the venting gases into the load lock. The pedestal is raised (block 612), and it lifts the wafer from the intermediate support pins with the MCA supports. The wafer may not be in contact with all MCA supports at this point. For example, the wafer may have distorted shape and only few of MCA supports contact with the low areas of the wafer. The pressure is uniform throughout the entire load lock at this point. Additionally, the wafer may be aligned relative to the cooling pedestal by the alignment cones. In one embodiment, loading of the wafer into the load lock takes between about 1 and 5 seconds, and the wafer may lose between about 10° C. and 50° C. during this time.

Once the wafer is positioned on the MCA supports, the venting cycle is initiated (block 616). One or more venting gases are introduced into the load lock through the venting port in the lid. The flow rate may be constant or variable. In certain embodiments, a variable flow rate is used to overcome variability of the temperature gradient during the venting cycle and thereby provide uniform heat transfer. The average flow rate depends on the internal volume of the load lock, which may be between about 1 L and 100 L and the duration of the venting cycle. In one embodiment employing a load lock having an internal volume of 2 and 10 liters, the flow rate is between about 10 and 50 standard liters per minute (SLM). In a more specific embodiment, the flow rate of the venting gas may be between about 20 and 40 SLM.

Various venting gases may be used. The choice depends primarily on cost and heat transfer coefficient. Of course, the gas should be inert to the wafer as well. Examples of suitable venting gases (depending on application) include hydrogen, helium, neon, methane, nitrogen, carbon oxide, ethane, ethylene, argon, butene, and combinations of thereof. In a specific embodiment, a venting gas is nitrogen or gas mixture that is primarily nitrogen. In another specific embodiment, a venting gas is primarily helium. Traditionally, helium has been used as a heat transfer gas because of its high heat transfer coefficient. Unfortunately, helium is relatively expensive. Because the present invention allows the wafer to sit very close to the pedestal, one may employ gases with lower heat transfer coefficients, which may be relatively inexpensive. Nitrogen is one such gas.

A combination of venting gases may be used. Such combination may have a constant or a variable composition. For example, the venting cycle may start with only helium flowing into the load lock, while nitrogen is introduced later. In this example, helium's flow rate may be gradually decreased, and the nitrogen's flow rate may be increased. In another embodiment, the flow of the first gas may be instantly shut, while another gas may be introduced at this point. A certain total flow rate of the venting gases may be needed to maintain sufficient pressure differential across the wafer in the load lock.

During the venting cycle (block 616) the load lock is brought from its initial low pressure to a final high pressure. Three examples of the pressure profiles within the load lock during the transfer process are discussed in the context of FIG. 7. In each example, the pressure increases continuously in the load lock during venting. The pressure profile is chosen to maintaining a pressure differential across the wafer. The pressure differential should be of sufficient magnitude to force the wafer to sit flat against all the MCA pins. In alternative embodiments, the load lock pressure remains constant (or even decreases) during venting. However, to keep the wafer pinned flat against the MCA pins, such embodiments generally require pumping some venting gas out of the load lock through a center portion of the pedestal in order to create a pressure differential across the wafer.

At least during part of the venting cycle, sufficient pressure differential is created for flattening of the wafer. In certain embodiments, the pressure differential around the center of the wafer is at least about 0.001 psi, more specifically at least about 0.002 psi, and in some cases at least about 0.010 psi. The backside of the wafer may come in the contact with all or most of the MCA support. In one embodiment, the sufficient pressure differential is maintained for at least about 70% of the entire venting operation (block 616) duration. In a more specific embodiment, it is maintained for at least about 90% of the entire venting operation duration.

Upon completion of the venting cycle (block 616), the pressure of the load lock is the same as on the high pressure side. The external transfer port of the load lock is opened and the purging cycle may be performed (block 618). The purging cycle involves providing one or more inert gases, such as argon, helium, nitrogen, or any other gases, to shield the wafer from oxidation at least during initial removal operations. The inert gases may be supplied through the venting port or a separate purging port. In one embodiment, no pressure differential across the wafer is maintained at this point.

The pedestal is then lowered and the wafer is kept on the intermediate support pins as indicated in block 620. Creating the increased gap between the wafer and the pedestal allows the robot arm of the external wafer handling system to reach under the wafer, lift the wafer from the pins, and remove it from the load lock (operation 622). It should be noted that flattening of the wafer in order to reduce the spacing to a pedestal surface and thereby improve the heat transfer between the wafer and the surface may be used for heating of the wafer. In other words, the concepts of this invention can be employed heat or cool wafers; it is possible to raise pressure during the heating or cooling cycle. In certain embodiments, the invention applies during a constant pressure operation with adequate pumping to exert force on the backside of the wafer.

Figure 7:
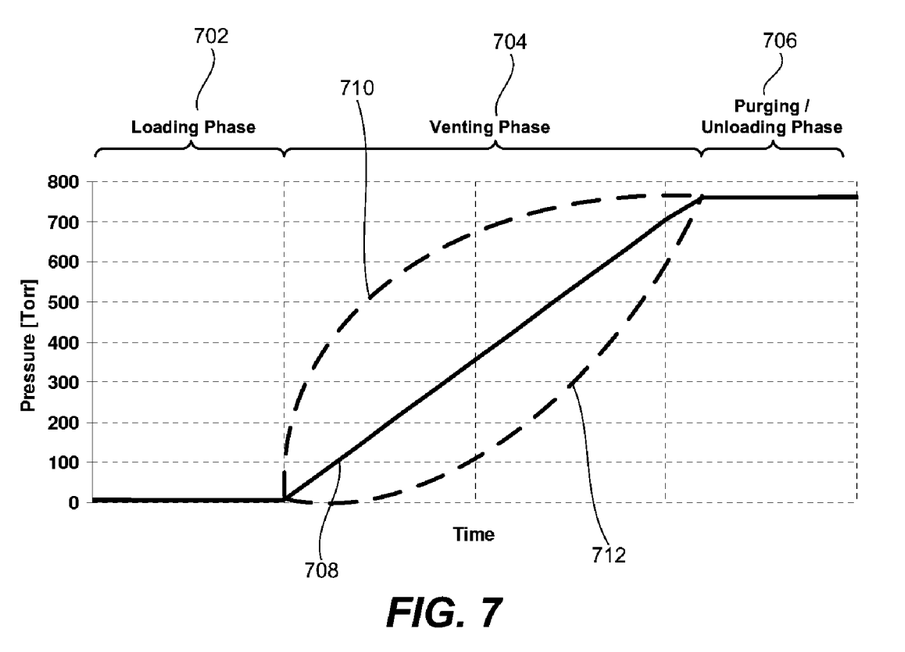
FIG. 7 illustrates a plot of the overall pressure inside the load lock as a function of time during a transferring and cooling process in accordance with certain embodiments the present invention.

FIG. 7 is a plot of the pressure inside the load lock as a function of time during, loading, venting and purging phases in accordance with one embodiment. During the loading phase 702, the wafer is introduced into the load lock through an open internal transfer port. As indicated above, the pressure within load lock during this phase must be the same as on the low pressure side. After the transfer is completed, the transfer port is closed, and the load lock begins the venting phase 704. One or more of venting gases are introduced during this phase. The overall flow rate of the supplied venting gases together with the pumping flow rate, if pumping is used, determines the pressure profile inside the load lock.

FIG. 7 illustrates three examples of the pressure profiles where the pressure inside the load lock is gradually increased. In one example, the pressure increase is constant as illustrated by line 708. Without being restricted to any particular theory, it is believed that a constant pressure increase (line 708) achieves more uniform heat transfer and a relatively constant pressure differential across the wafer.

Alternatively, the pressure may be more rapidly increased at the beginning of the venting phase as shown in the pressure profile 710. This may rapidly increase the heat transfer coefficient and at the same time provide a greater initial pressure differential for flattening the wafer. In another embodiment, the pressure is slowly increased at the beginning and then more rapidly increased towards the end of the venting phase as shown in the profile 712. The selection of a particular pressure profile may be based on a desired temperature change profile for wafer during the transfer, heat conductivities of venting gases, duration of the venting phase, pressure differential requirements, and other parameters.

Upon completion of the venting phase 704, the pressure inside the load lock is approximately the same as the external high pressure. At this point the purging/unloading phase 706 is initiated. The external transfer port may be opened and purging gases are introduced into the load lock. The duration of this phase may be between 1 and 20 seconds. In a specific embodiment, the purging/unloading phase may last for 3 to 10 seconds.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A load lock for cooling wafers after processing, the load lock comprising:
   (a) an inlet transfer port for receiving the wafers after processing;
   (b) an outlet transfer port for removing the wafers after cooling;
   (c) a pedestal having a surface for absorbing heat from the wafers, said surface being structured to prevent a venting gas from passing through the pedestal while absorbing heat from the wafers;
   (d) a venting non-process gas port for delivering a venting gas above the pedestal surface to increase pressure inside the load lock, the venting gas port shaped as a ring and comprising an opening facing a center of the ring, the opening configured to direct the venting non-process gas above and parallel to front surfaces of the wafers upon leaving the opening, wherein a diameter of the ring is smaller than a diameter of the wafers; and
   (e) at least three supports provided on the pedestal surface, wherein said supports have heights which provide an average gap between one of the wafers and the pedestal surface of no greater than about 0.010 inches, when the one of the wafers is supported by the supports.

2. The load lock of claim 1, wherein the average gap is no greater than about 0.005 inches.

3. The load lock of claim 1, wherein the average gap is no greater than about 0.002 inches.

4. The load lock of claim 1, wherein the venting gas port has a venting gas port opening having a diameter of between about 4 inches and 8 inches.

5. The load lock of claim 4, wherein the venting gas port opening has a diameter of between about 6 inches and 6.5 inches.

6. The load lock of claim 4, wherein the venting gas port opening has a width of between about 0.010 inches and 0.100 inches.

7. The load lock of claim 4, further comprising a load lock lid and a load lock body, and wherein the venting gas port opening is defined by the load lock lid and the load lock body.

8. The load lock of claim 1, further comprising a venting gas source coupled to the venting gas port, wherein the venting gas is substantially free of helium.

9. The load lock of claim 1, wherein the venting gas comprises nitrogen.

10. The load lock of claim 1, wherein the pedestal surface has a convex shape.

11. The load lock of claim 1, wherein a difference between an edge gap and a center gap is between about 0.001 inches and 0.010 inches.

12. The load lock of claim 1, wherein a difference between an edge gap and a center gap is between about 0.001 inches and 0.003 inches.

13. The load lock of claim 1, wherein at least ten supports are provided.

14. The load lock of claim 1, wherein the supports are arranged within at least a first ring and a second ring on the pedestal and wherein the first ring is positioned between about 4 inches and 6 inches from a center of the pedestal and wherein the second ring is positioned between about 1 inch and 3 inches from the center of the pedestal.

15. The load lock of claim 14, wherein at least six supports are provided within the first ring and at least three supports are provided within the second ring.

16. The load lock of claim 1, wherein tips of the supports provide a flat plane above the surface of the pedestal.

17. The load lock of claim 1, wherein the supports have rounded tips.

18. The load lock of claim 1, wherein the supports have diameter of between about 0.020 and 0.125 inches.

19. The load lock of claim 1, wherein the supports comprise a thermally insulating material.

20. The load lock of claim 1, wherein the supports comprise an electrically conductive ceramic material.

21. The load lock of claim 1, further comprising a controller comprising program instructions for:
   (a) providing the wafer to the load lock;
   (b) positioning the wafer on the supports;
   (c) closing the inlet transfer port;
   (d) controlling pressure inside the load lock to keep the wafer in contact with at least 70% of the supports; and
   (e) opening the outlet transfer port and removing the wafer.

22. The load lock of claim 1, wherein the wafer comprises an outer edge and a center and wherein the pedestal surface forming a gap with the wafer during absorbing heat from the wafers, the gap being filed with the venting gas passing through the gap from the outer edge to the center.

23. A method of cooling and transferring a wafer from a low pressure side to a high pressure side using a load lock, the method comprising:
   (a) providing the wafer into the load lock;
   (b) positioning the wafer on supports provided on a pedestal having a surface for absorbing heat from the wafers, said surface being structured to prevent a venting gas from passing through the pedestal while absorbing heat from the wafers;
   (c) closing an inlet transfer port;
   (d) increasing pressure inside the load lock by delivering a venting non-process gas through a venting gas port shaped as a ring and comprising an opening facing a center of the ring, wherein a diameter of the ring is smaller than a diameter of the wafer and wherein the venting non-process gas is delivered parallel above and parallel to a front side of the wafer and to keeps the wafer in contact with at least 70% of the supports by creating pressure differential at a center of the wafer such that pressure at the front side of the wafer is greater than pressure at a back side of the wafer forcing at least the center of the wafer towards the supports; and
   (e) opening an outlet transfer port and removing the wafer.

24. The method of claim 23, wherein controlling the pressure comprises providing the venting gas, and wherein the venting gas is substantially free of helium.

25. The method of claim 23, wherein controlling the pressure comprises increasing the pressure inside the load lock at a rate of at least 30 Torr per seconds.

26. The method of claim 23, wherein controlling the pressure comprises providing the venting gas at a flow rate between about 10 and 50 standard liters per minute.

27. The method of claim 23, wherein controlling the pressure is performed in less than 15 seconds, and wherein a temperature of the wafer decreases by at least 200 degrees Centigrade during this time.

28. The method of claim 23, wherein controlling the pressure creates a pressure differential on opposite sides of the wafers creating a downward force directed towards the supports and forcing the wafer against the supports.

* * * * *